United States Patent
Warren

(10) Patent No.: US 6,435,883 B1
(45) Date of Patent: Aug. 20, 2002

(54) HIGH DENSITY MULTICHIP INTERCONNECT DECAL GRID ARRAY WITH EPOXY INTERCONNECTS AND TRANSFER TAPE UNDERFILL

(75) Inventor: Robert W. Warren, Newport Beach, CA (US)

(73) Assignee: Raytheon Company, Lexington, MA (US)

( * ) Notice: Subject to any disclaimer, the term of this patent is extended or adjusted under 35 U.S.C. 154(b) by 551 days.

(21) Appl. No.: 08/936,321

(22) Filed: Sep. 24, 1997

(51) Int. Cl.[7] ............................................. H01R 12/00
(52) U.S. Cl. ........................................ 439/71; 439/91
(58) Field of Search ............................ 439/71, 72, 73, 439/91; 361/749, 789

(56) References Cited

U.S. PATENT DOCUMENTS

| | | | | |
|---|---|---|---|---|
| 4,664,309 A | * | 5/1987 | Allen et al. ................... | 439/74 |
| 4,783,722 A | * | 11/1988 | Osaki et al. .................. | 439/74 |
| 4,902,857 A | * | 2/1990 | Cranston et al. .............. | 439/91 |
| 5,046,953 A | * | 9/1991 | Shreeve et al. ............... | 439/66 |
| 5,258,648 A | * | 11/1993 | Lin .............................. | 439/912 |
| 5,263,248 A | * | 11/1993 | Kiyota et al. ................ | 361/749 |
| 5,346,750 A | * | 9/1994 | Hatakeyama et al. ....... | 439/749 |
| 5,431,571 A | * | 7/1995 | Hanrahan et al. ............ | 439/91 |

* cited by examiner

*Primary Examiner*—Tulsidas Patel
(74) *Attorney, Agent, or Firm*—Leonard A. Alkov; Glenn H. Lenzen, Jr.

(57) ABSTRACT

A grid array interconnect structure and method for interconnecting and removing a high density multichip interconnect decal, or grid array package, to and from a printed wiring board. The interconnect structure comprises conductive epoxy interconnects and nonconductive transfer tape that has adhesive disposed on both sides thereof. The transfer tape is applied to the back of the high density multichip interconnect decal or package. Conductive epoxy is disposed in pre-formed holes of the two-sided transfer tape and is partially cured to a semi-rigid condition to form the conductive epoxy interconnects. A mylar film may be applied to the exposed surface of the transfer tape. With the mylar film removed from the surface of the transfer tape, the decal or package is secured to the printed wiring board and a slight force is applied. This assembly is then cured. The decal or package may be removed and replaced without damage to the printed wiring board by reheating the assembly to soften the transfer tape and interconnects.

5 Claims, 2 Drawing Sheets

┌─────────────────────────────────────────────────────────┐
│ APPLYING NONCONDUCTIVE TRANSFER TAPE HAVING A           │— 21
│ PLURALITY OF PRE-FORMED HOLES THERETHROUGH TO THE       │
│ BACK OF A MULTICHIP INTERCONNECT DECAL OR PACKAGE       │
└─────────────────────────────────────────────────────────┘
                             ↓
┌─────────────────────────────────────────────────────────┐
│ DISPOSING CONDUCTIVE EPOXY INTO THE PRE-FORMED          │— 22
│ HOLES OF THE TRANSFER TAPE                              │
└─────────────────────────────────────────────────────────┘
                             ↓
┌─────────────────────────────────────────────────────────┐
│ PARTIALLY CURING THE TRANSFER TAPE AND CONDUCTIVE       │— 23
│ EPOXY TO A SEMI-RIGID CONDITION AT A FIRST              │
│ PREDETERMINED TEMPERATURE TO FORM A PLURALITY OF        │
│ CONDUCTIVE EPOXY INTERCONNECTS                          │
└─────────────────────────────────────────────────────────┘
                             ↓
┌ ─ ─ ─ ─ ─ ─ ─ ─ ─ ─ ─ ─ ─ ─ ─ ─ ─ ─ ─ ─ ─ ─ ─ ─ ─ ─ ─ ┐
  APPLYING A MYLAR FILM TO THE EXPOSED                    — 26
  SURFACE OF THE TRANSFER TAPE
└ ─ ─ ─ ─ ─ ─ ─ ─ ─ ─ ─ ─ ─ ─ ─ ─ ─ ─ ─ ─ ─ ─ ─ ─ ─ ─ ─ ┘
                             ↓
┌ ─ ─ ─ ─ ─ ─ ─ ─ ─ ─ ─ ─ ─ ─ ─ ─ ─ ─ ─ ─ ─ ─ ─ ─ ─ ─ ─ ┐
  REMOVING THE MYLAR FILM FROM THE TRANSFER TAPE          — 26a
└ ─ ─ ─ ─ ─ ─ ─ ─ ─ ─ ─ ─ ─ ─ ─ ─ ─ ─ ─ ─ ─ ─ ─ ─ ─ ─ ─ ┘
                             ↓
┌─────────────────────────────────────────────────────────┐
│ SECURING THE HIGH DENSITY MULTICHIP INTERCONNECT        │— 24
│ DECAL OR PACKAGE TO THE PRINTED WIRING BOARD USING      │
│ THE TRANSFER TAPE                                       │
└─────────────────────────────────────────────────────────┘
                             ↓
┌─────────────────────────────────────────────────────────┐
│ CURING THE MULTICHIP INTERCONNECT DECAL OR              │— 25
│ PACKAGE, TRANSFER TAPE AND PRINTED WIRING               │
│ BOARD AT A SECOND PREDETERMINED TEMPERATURE             │
└─────────────────────────────────────────────────────────┘
                             ↓
┌─────────────────────────────────────────────────────────┐
│ REMOVING THE INTERCONNECT DECAL OR PACKAGE              │— 27
│ FROM THE PRINTED WIRING BOARD BY HEATING THE            │
│ CONDUCTIVE EPOXY INTERCONNECTS AND                      │
│ NONCONDUCTIVE TRANSFER TAPE                             │
└─────────────────────────────────────────────────────────┘

HIGH DENSITY MULTICHIP INTERCONNECT DECAL GRID ARRAY WITH EPOXY INTERCONNECTS AND TRANSFER TAPE UNDERFILL

BACKGROUND

The present invention relates generally to interconnect structures and methods, and more particularly, to a grid array interconnect structure employing epoxy interconnects and transfer tape underfill for interconnecting high density multichip interconnect decals or land grid array packages to printed wiring boards, and interconnection methods employing the interconnect structure.

Known prior art relating to the present invention are solder attached ball grid arrays and chip scale packages. The disadvantages of these products are that they are relatively low density interconnect structures, and they are attached using solder. Furthermore, interconnection of certain semiconductor devices to printed wiring boards is hindered because of mismatches in the coefficients of thermal expansion of the printed wiring boards and the devices or carriers that hold the devices. In addition, removal of soldered devices from underlying printed wiring boards is generally difficult, costly and time consuming.

Accordingly, it is an objective of the present invention to provide for a grid array interconnect structure that may be used to interconnect high density multichip interconnect decals or land grid array packages to printed wiring boards. It is another objective of the present invention to provide for a grid array interconnect structure employing epoxy interconnects and transfer tape underfill. It is a further objective of the present invention to provide for a grid array interconnect structure that eliminates mismatch problems relating to differences in coefficients of thermal expansion between the printed wiring boards and the high density multichip interconnect decals. It is another objective of the present invention to provide for methods of interconnecting and removing high density multichip interconnect decals or land grid array packages to and from printed wiring boards.

SUMMARY OF THE INVENTION

To meet the above and other objectives, the present invention provides for a grid array interconnect structure that may be used to interconnect high density multichip interconnect decals, or packages having land grid arrays, to printed wiring boards. In accordance with the present invention, a two-sided high density multichip interconnect decal, or package having land grid arrays, is interconnected to a printed wiring board using low temperature, easy to process and reworkable, polymeric materials. In particular, the high density multichip interconnect decal or package is interconnected to the printed wiring board using a grid array interconnect structure comprised of conductive epoxy interconnects and transfer tape underfill.

Conductive epoxy, in the form of epoxy paste or preforms that are 0.025 inches in diameter on 0.050 inch centers is used to provide interconnection between input/output (I/O) pads of the high density multichip interconnect decal, or the land grid array of the package, and I/O pads of the printed wiring board. The nonconductive transfer tape acts as a stress absorbing underfill material, compensating for any mismatches in the coefficients of thermal expansion between the high density multichip interconnect decal and the underlying printed wiring board.

In practicing the present invention, nonconductive two-sided transfer tape is applied to the back of a two-sided high density multichip interconnect decal. Conductive epoxy is screen printed or dispensed into pre-formed holes on one side of the two-sided transfer tape and is then partially cured to a semi-rigid condition (beta staged) at a first predetermined temperature. A mylar film may be applied to the exposed surface of the transfer tape.

When the high density multichip interconnect decal is to be connected to the printed wiring board, the mylar film is removed from the surface of the transfer tape and the high density multichip interconnect decal is placed into position on the printed wiring board and a slight force is applied. This assembly is then cured at a second, relatively low temperature.

The high density multichip interconnect decal may be removed and replaced without damage to the printed wiring board. The conductive polymer interconnects and nonconductive underfill softens at a third relatively low temperature, and when softened, the high density multichip interconnect decal may be removed from the printed wiring board.

Thus, the present invention also provides for a method of interconnecting a high density multichip interconnect decal or land grid array package having a plurality of interconnect pads to a printed wiring board having a plurality of I/O pads. The method comprises applying nonconductive transfer tape having a plurality of pre-formed holes therethrough to the back of the high density multichip interconnect decal or package. Conductive epoxy is disposed into the pre-formed holes of the transfer tape. The transfer tape and conductive epoxy is partially cured to a semi-rigid condition at a first predetermined temperature to form a plurality of conductive epoxy interconnects. The high density multichip interconnect decal or package is secured to the printed wiring board using the transfer tape. Finally, the assembled high density multichip interconnect decal or package, transfer tape and printed wiring board are cured at a second predetermined temperature.

BRIEF DESCRIPTION OF THE DRAWINGS

The various features and advantages of the present invention may be more readily understood with reference to the following detailed description taken in conjunction with the accompanying drawings, wherein like reference numerals represent like structural elements, and in which:

FIG. 4 is a flow diagram illustrating methods in accordance with the principles of the present invention.

DETAILED DESCRIPTION

Figure 1:
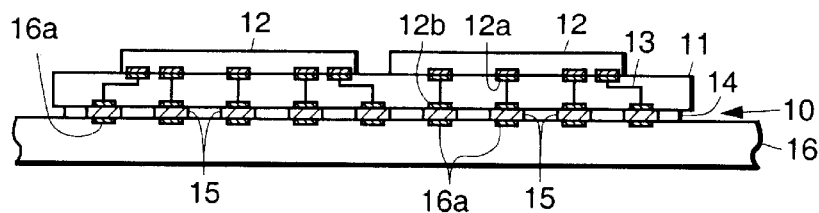
FIG. 1 illustrates a side view of a high density multichip interconnect decal interconnected to a printed wiring board using a grid array interconnect structure in accordance with the principles of the present invention.
Figure 2:
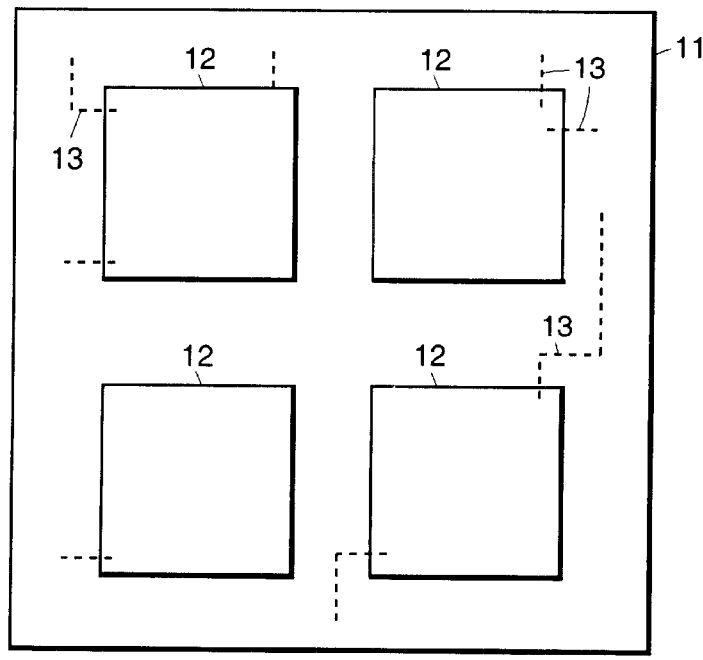
FIG. 2 illustrates a top view of the high density multichip interconnect decal shown in FIG. 1.
Figure 3:
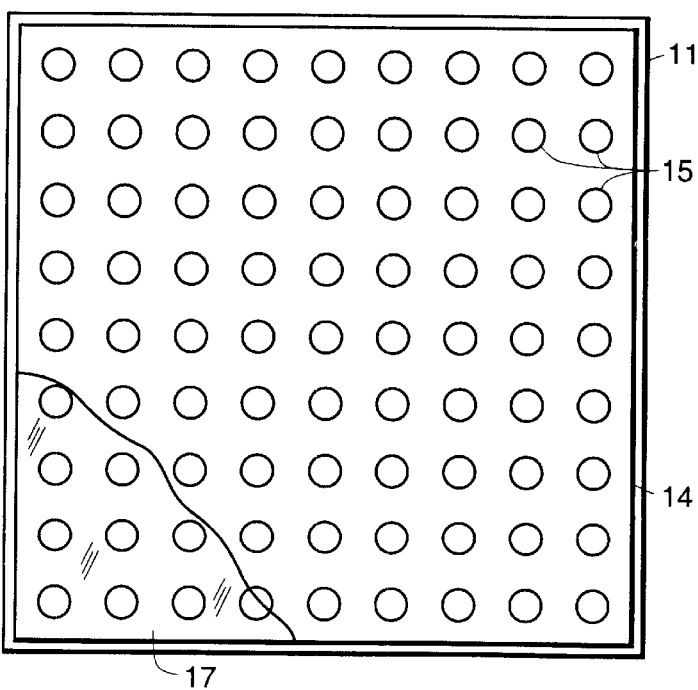
FIG. 3 illustrates a bottom view of the grid array interconnect structure of the present invention.

Referring to the drawing figures, FIG. 1 illustrates a side view of a high density multichip interconnect decal 11, or land grid array package 11, interconnected to a printed wiring board 16 using a grid array interconnect structure 10 in accordance with the principles of the present invention. FIG. 2 illustrates a top view of the high density multichip interconnect decal 11 shown in FIG. 1. FIG. 3 illustrates a bottom view of the grid array interconnect structure 10 of the present invention.

Referring to FIGS. 1-3, the grid array interconnect structure 10 that may be used to interconnect the high density multichip interconnect decal 11, or land grid array package 11, to the printed wiring board 16. The high density multichip interconnect decal 11, or land grid array package 11, is two-sided in that it has semiconductor devices 12 disposed on one side that have I/O pads 12a that are routed to the other side of the decal 11 or package 11 by way of conductive traces 13, and terminate in a plurality of interconnect pads 12b, such as a land grid array 12b.

The high density multichip interconnect decal 11, or land grid array package 11, is interconnected to the printed wiring board 16 using the present grid array interconnect structure 10. The grid array interconnect structure 10 comprises low temperature, easy to process and reworkable, polymeric materials. The grid array interconnect structure 10 is comprised of conductive epoxy interconnects 15 and nonconductive transfer tape 14, or transfer tape underfill 14. The nonconductive transfer tape 14 has adhesive disposed on both sides thereof.

The epoxy interconnects 15 comprise conductive epoxy pads 15 in the form of epoxy paste or pre-forms that may be for example, 0.025 inches in diameter on 0.050 inch centers. The conductive epoxy interconnects 15 are used to provide interconnection between the interconnect pads 12b of the high density multichip interconnect decal 11, or the land grid array package 11, and I/O pads 16a of the printed wiring board 16. The nonconductive transfer tape 14 acts as a stress absorbing underfill material, compensating for mismatches in the coefficients of thermal expansion between the high density multichip interconnect decal 11 or package 11, and the underlying printed wiring board 16.

Referring to FIG. 4, it is a flow diagram illustrating methods 20 in accordance with the principles of the present invention. In practicing the present invention, nonconductive transfer tape 14 is applied 21 to the back of a high density multichip interconnect decal 11 or package 11. Conductive epoxy is screen printed 22 or dispensed 22 into pre-formed holes on one side of the two-sided transfer tape 14 and is then partially cured 23 to a semi-rigid condition (beta staged). This forms the conductive epoxy interconnects 15. A mylar film 17 (FIG. 3) may be applied 26 to the exposed surface of the transfer tape 14.

When the high density multichip interconnect decal 11 or package 11 is to be connected to the printed wiring board 16, the mylar film 17 is removed 26a from the surface of the transfer tape 14. The high density multichip interconnect decal 11 or package 11 is placed into position on the printed wiring board 16 and a slight force is applied to secure 24 them together. This assembly is then cured 25 at a low temperature, typically on the order of 125–150 degrees Celsius.

The high density multichip interconnect decal 11 or package 11 may be removed 27 and replaced without damage to the printed wiring board 16. The conductive epoxy (polymer) interconnects 15 and nonconductive transfer tape underfill 14 soften at a relatively low temperature, typically on the order of 125–175 degrees Celsius, and when softened, the high density multichip interconnect decal 11 or package 11 may be removed from the printed wiring board 16.

The present invention permits high density multichip interconnect decals 11, or packages 11 having land grid arrays, to be interconnected to printed wiring boards 16 without the use of a higher cost solder and liquid underfill process. The use of epoxy as the conductive medium provides lower cost in assembly since there are fewer processes and steps required (no reflow and no cleaning).

Also, the pre-formed transfer tape underfill 14 is used in place of liquid underfill. There are no voids to contend with as is the case when dispensing liquid underfill materials under the high density multichip interconnect decal or land grid array package.

The pre-formed tape transfer underfill 14 also serves to limit epoxy migration between I/O pads under biased humidity, as well as limiting epoxy shorting between I/O pads before curing of the conductive adhesive.

The present grid array interconnect structure 10 may be employed in radar, communication, missile and electro-optical systems to interconnect high density multichip interconnect decals 11 or land grid array packages 11 containing silicon semiconductor devices 12, for example, to low cost printed wiring boards 16.

Thus, a grid array interconnect structure employing epoxy interconnects and transfer tape underfill for interconnecting high density multichip interconnect decals or land grid array package to printed wiring boards has been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A grid array interconnect structure for use in interconnecting a high density multichip interconnect decal or land grid array package having a plurality of interconnect pads to a printed wiring board having a plurality of input/output pads, said interconnect structure comprising:

double-sided nonconductive transfer tape having adhesive disposed on both sides thereof, and having conductive epoxy interconnects formed therethrough that are configured to connect to the interconnect pads of the high density multichip interconnect decal, or the land grid array package, the input/output pads of the printed wiring board.

2. The interconnect structure of claim 1 wherein the conductive epoxy interconnects comprise conductive epoxy pads that are about 0.025 inches in diameter on about 0.050 inch centers.

3. The interconnect structure of claim 1 wherein the conductive epoxy interconnects comprise conductive epoxy pads in the form of epoxy paste that are about 0.025 inches in diameter on about 0.050 inch centers.

4. The interconnect structure of claim 1 wherein the conductive epoxy interconnects comprise conductive epoxy pads in the form of epoxy pre-forms that are about 0.025 inches in diameter on about 0.050 inch centers.

5. The interconnect structure of claim 1 wherein the nonconductive transfer tape comprises a stress absorbing underfill material that compensates for mismatches in coefficients of thermal expansion between the high density multichip interconnect decal or land grid array package, and the printed wiring board.

* * * * *